US008892972B2

(12) United States Patent
Ackerman et al.

(10) Patent No.: US 8,892,972 B2
(45) Date of Patent: *Nov. 18, 2014

(54) SCAN CHAIN FAULT DIAGNOSIS

(71) Applicant: Teseda Corporation, Portland, OR (US)

(72) Inventors: Rich Ackerman, Wilsonville, OR (US); John Raykowski, Beaverton, OR (US)

(73) Assignee: Teseda Corporation, Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/025,700

(22) Filed: Sep. 12, 2013

(65) Prior Publication Data

US 2014/0115412 A1    Apr. 24, 2014

Related U.S. Application Data

(63) Continuation of application No. 13/852,892, filed on Mar. 28, 2013, now Pat. No. 8,560,904, which is a continuation of application No. 13/225,168, filed on Sep. 26, 2011, now Pat. No. 8,412,991.

(51) Int. Cl.
*G01R 31/28* (2006.01)
*G01R 31/3173* (2006.01)
*G01R 31/3185* (2006.01)
*G01R 31/3177* (2006.01)

(52) U.S. Cl.
CPC .... *G01R 31/3173* (2013.01); *G01R 31/318536* (2013.01); *G01R 31/318569* (2013.01); *G01R 31/3177* (2013.01)
USPC ............................................. 714/726; 714/30

(58) Field of Classification Search
CPC .............................................. G01R 31/318536
USPC ....................................................... 714/726, 30
See application file for complete search history.

(56) References Cited

U.S. PATENT DOCUMENTS

| 5,490,151 | A | * | 2/1996 | Feger et al. ................ 714/727 |
| 5,696,771 | A | * | 12/1997 | Beausang et al. ........... 714/726 |
| 5,717,701 | A | * | 2/1998 | Angelotti et al. ............ 714/30 |
| 6,185,707 | B1 | | 2/2001 | Smith |
| 6,618,827 | B1 | * | 9/2003 | Benavides ................... 714/726 |
| 6,628,141 | B1 | * | 9/2003 | Alt et al. ........................ 326/46 |
| 6,832,122 | B1 | | 12/2004 | Huber |
| 7,729,884 | B2 | | 6/2010 | Huang |
| 8,412,991 | B2 | | 4/2013 | Ackerman |

(Continued)

OTHER PUBLICATIONS

Stolowitz Ford Cowger LLP; Related Case Listing; Portland, OR; Jul. 1, 2014; 2 Pages.

(Continued)

*Primary Examiner* — Esaw Abraham
(74) *Attorney, Agent, or Firm* — Stolowitz Ford Cowger LLP (57) ABSTRACT

Embodiments related to identifying a reference scan cell locationally related to a fault condition exhibited by a scan chain in which the reference scan cell is included are provided. In one example, a method for identifying a reference scan cell is provided, the method comprising, in a capture mode, outputting combinational logic values to scan cells in the scan chain so that scan cell values for the scan cells are based on respective combinational logic values, the combinational logic values electrically connected with the scan chain. The example method further comprises, in a shift mode, sequentially determining the scan cell value for each scan cell, and identifying as the reference scan cell a scan cell last determined to be at an expected logical state for that scan cell.

6 Claims, 10 Drawing Sheets

(56) References Cited

U.S. PATENT DOCUMENTS

| | | |
|---|---|---|
| 8,453,088 B2 | 5/2013 | Akar |
| 8,539,389 B2 | 9/2013 | Akar |
| 8,560,904 B2 | 10/2013 | Ackerman |
| 8,626,460 B2 | 1/2014 | Kaufman |
| 2005/0066294 A1 | 3/2005 | Templeton |
| 2006/0053357 A1 | 3/2006 | Rajski |
| 2007/0011519 A1 | 1/2007 | Takeda |
| 2007/0016879 A1 | 1/2007 | Kuo |
| 2007/0143718 A1 | 6/2007 | Abercrombie |
| 2008/0091981 A1 | 4/2008 | Dokken |
| 2008/0284453 A1 | 11/2008 | Swenton |
| 2010/0332172 A1 | 12/2010 | Kaufman |
| 2014/0115412 A1 | 4/2014 | Ackerman |
| 2014/0115551 A1 | 4/2014 | Akar |

OTHER PUBLICATIONS

Kashyap, Chandramouli et al., "Silicon feedback to improve frequency of high-performance microprocessors—an overview"; Published in Proceedings ICCAD '08 Proceedings of the 2008 IEEE/ACM International Conference on Computer-Aided Design; 2008; 5 pages.

* cited by examiner

SCAN CHAIN FAULT DIAGNOSIS

RELATED APPLICATIONS

This application is a continuation of U.S. patent application Ser. No. 13/852,892 filed on Mar. 28, 2013, now issued as U.S. Pat. No. 8,560,904, which is a continuation of U.S. patent application Ser. No. 13/225,168, filed Sep. 2, 2011, issued as U.S. Pat. No. 8,412,991, all of which is incorporated herein by reference in its entirety.

BACKGROUND

Scan testing of semiconductor devices is often used to check the functional operation of die. Scan testing employs scan chains arranged on the die to test the logic connected therewith. During a scan test, the integrity of the scan chain is checked to determine whether the scan chain is functional prior to performing functional checks of combinational logic connected with the scan chain. However, it can be difficult to determine the location of a defect in the scan chain, complicating failure analysis.

SUMMARY

Various embodiments are disclosed herein that relate to identifying a reference scan cell locationally related to a fault condition exhibited by a scan chain in which the reference scan cell is included. For example, one embodiment provides a method for identifying a reference scan cell, the method comprising, in a capture mode, outputting combinational logic values to scan cells in the scan chain so that scan cell values for the scan cells are based on respective combinational logic values, the combinational logic values electrically connected with the scan chain. The example method further comprises, in a shift mode, sequentially determining the scan cell value for each scan cell, and identifying as the reference scan cell a scan cell last determined to be at an expected logical state for that scan cell.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Scan testing of semiconductor devices is often used to check the functional operation of die prior to shipping and, in some cases, during failure analysis of non-functional semiconductor devices. In some designs, scan may be used to test more than 98% of the architectural structures present on the die. The number of scan chains providing scan coverage has increased along with the expanding number of devices present in modern designs. Consequently, it is becoming more common for manufacturing defects to affect the scan chains.

Scan tests are typically performed by providing a test vector to a scan chain that provides test coverage to a portion of the die. Typically, a scan test includes a chain test used to check the integrity of the scan chain. In the chain test, a test vector is shifted through a scan chain. If the test vector output matches the test vector input, the scan test goes on to check the combinational logic connected with that scan chain. The result of the evaluation may be used to determine whether those combinational logic cells may include manufacturing defects that inhibit proper device function.

Because data is shifted through a scan chain serially from the input to the output during the chain test, it is difficult to locate a defect within the scan chain. One approach for diagnosing a defect in a scan chain includes powering on the device in a known state after a reset, so that a known value is loaded into various state elements of the device, such as flip-flops and the like. Then, when the scan test is executed, the known state is the first to be shifted out of the scan chain. By comparing the observed output of the scan chain to the output of a known non-defective scan chain, it may be possible to exclude some possible defect locations. Such approaches may be hindered by the particular reset state selected and by the inherent one-shot nature of the reset state.

Other approaches may include fault simulation of the scan chain. Such approaches are computationally intensive and frequently require extensive knowledge of the logical design of the device provide by electronic design automation software. Because electronic design automation software is often tuned toward device design rather than defect diagnosis, it may require the involvement of device architects rather than failure analysis engineers, potentially adding to the expense of the excursion and delaying other projects.

The disclosed embodiments relate to identifying a reference scan cell locationally related to a fault condition exhibited by a scan chain in which the reference scan cell is included. For example, a method for identifying a reference scan cell is disclosed, the method comprising, in a capture mode, outputting combinational logic values to scan cells in the scan chain so that scan cell values for the scan cells are based on respective combinational logic values, the combinational logic values electrically connected with the scan chain. The example method further comprises, in a shift mode, sequentially determining the scan cell value for each scan cell, and identifying as the reference scan cell a scan cell last determined to be at an expected logical state for that scan cell.

A scan chain represents a logical path between a scan chain input, where a test vector is input, and a scan chain output, where the test vector is output for evaluation. Scan chains provide input to and receive output from combinational logic cells connected to the scan chains via scan cells. For clarity, the embodiments described herein refer to testing a single scan chain. However, it will be appreciated that any suitable number of scan chains may be tested without departing from the scope of the present disclosure. For example, in some embodiments, every scan chain on a device may be tested. In some other embodiments, only a subset of scan chains on a device may be tested, such as in system-on-a-chip devices.

Figure 1:
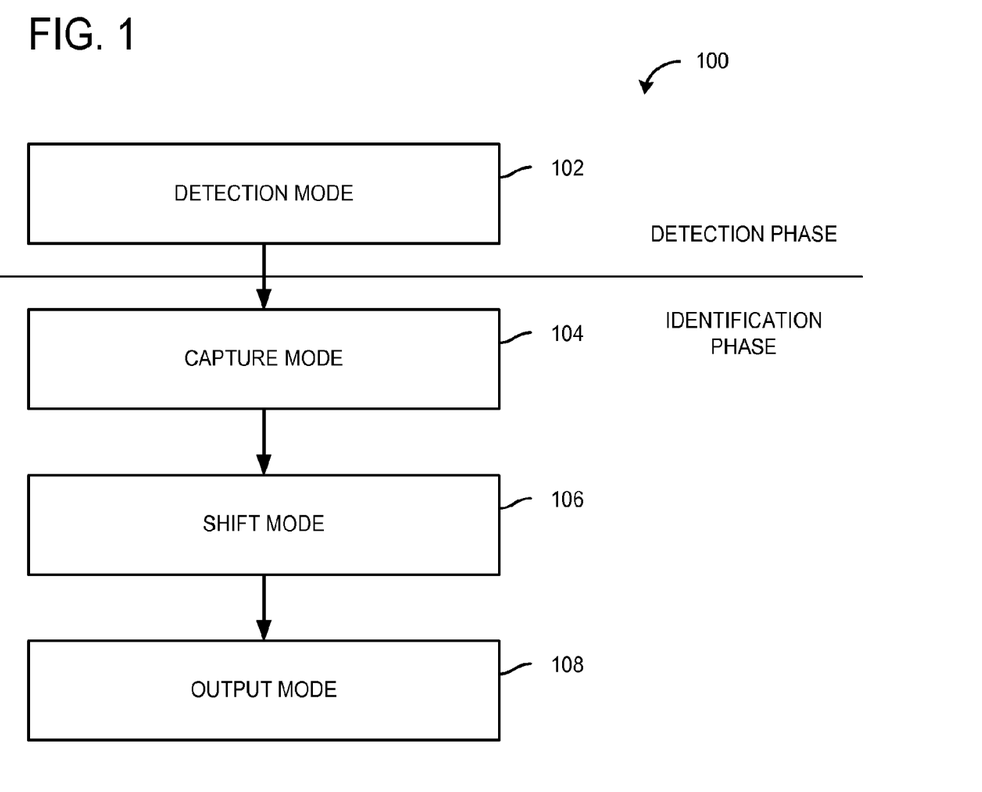
FIG. 1 shows a flowchart for a method of detecting a potential scan chain defect condition and identifying a reference scan cell locationally related to the defect condition according to an embodiment of the present disclosure.

FIG. 1 shows a flowchart for an embodiment of a method 100 for detecting a candidate scan chain defect condition and identifying a reference scan cell in the scan chain that may be used to potentially locate, in logical and/or physical space, a defect giving rise to the detected defect condition. As shown in FIG. 1, method 100 is broadly divided into detection and identification phases for illustrative purposes only, and is not intended to be limiting in any way.

At 102, method 100 comprises a detection mode configured to detect a candidate scan chain defect. Virtually any suitable scan chain defect condition may be detected according to the disclosed embodiments. Non-limiting examples of scan chain defect conditions that may be detected in detection mode 102 include a candidate stuck-at condition, a candidate slow to rise and/or slow to fall condition, and a candidate cycle early and/or cycle late condition. Examples of such defect conditions will be described in more detail below.

Figure 2:
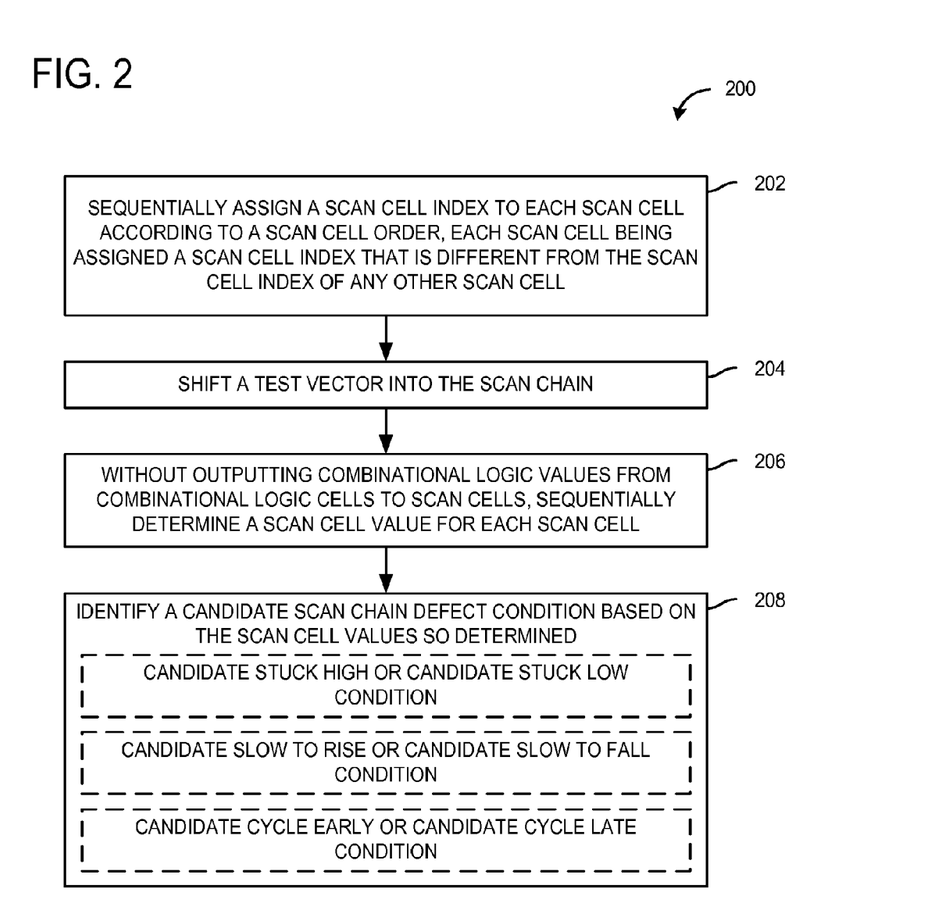
FIG. 2 shows a flowchart for a method of a detection phase according to an embodiment of the present disclosure.

FIG. 2 shows a flowchart for an embodiment of a method 200 of detecting a scan chain defect. Method 200 comprises, at 202, sequentially assigning a scan cell index to each scan cell according to a scan cell order. By assigning each scan cell a scan cell index, the values assigned to the various scan cells within the scan chain may be tracked during the shift and capture operations described below. Each scan cell is assigned a scan cell index that is different from the scan cell index of any other scan cell, so that scan cells may be identified according to the scan cell index associated with the scan cell. The scan cell indices may be assigned in any suitable manner without departing from the scope of the present disclosure. For example, in some embodiments, scan cell indices may be ordered from a position where test vector values are shifted out of the scan chain (i.e., a scan out position) or, alternatively, via a position where test vector values are shifted into the scan chain (i.e., a scan in position). In some embodiments, the scan cell indices may be ordered according to an order in which scan cells are arranged in the scan chain (i.e., a scan cell order), though any suitable order may be used to assign the scan cell indices without departing from the scope of the present disclosure.

At 204, method 200 comprises shifting a test vector into the scan chain. In some embodiments, a test vector may be shifted into the scan chain by enabling a scan enable setting (e.g., by setting a scan enable setting to 1), placing the device into a shift mode. At each clock cycle, a successive bit of the test vector is shifted into the scan chain. Previously entered bits are shifted into the scan chain in a sequential manner until the entire scan chain is populated by the test vector and/or until the entire test vector is shifted into the scan chain.

Because the embodiments of method 200 described herein are directed at detecting candidate defects in the scan chain and not defects arising in the combinational logic, it may be helpful to observe the logical function of the scan chain without the confounding effects of the logical output of the combinational logic electrically connected to the scan chain. Thus, the test vector is shifted out of the scan chain without capturing the logical behavior of the combinational logic. In the embodiment shown in FIG. 2, method 200 comprises, at 206, sequentially determining the scan cell value for each scan cell without outputting combinational logic values from the combinational logic cells to the scan cells. In some embodiments, the test vector may be shifted out of the scan chain by enabling a scan enable setting, placing the device into a shift mode. At each clock cycle, a successive bit of the test vector is shifted out of the scan chain and a value is determined Previously entered bits are shifted out of the scan chain in a sequential manner until the entire content of the scan chain has been shifted out of the scan chain. By tracking the number of clock cycles, any determined value of may be matched, via the scan cell index, to the scan cell associated with that value. While shifting the test vector into the scan chain at 204 and determining the scan cell values at 206 are described above as separate events for illustrative purposes, it will be appreciated that, in some embodiments, shifting the test vector into the scan chain at 204 and determining the scan cell values at 206 may occur concurrently or sequentially without the device exiting and re-entering a shift mode.

At 208, method 200 comprises identifying a candidate scan chain defect condition based on the scan cell values so determined. Identification of a candidate scan chain defect condition may be accomplished by virtually any suitable approach. For example, the non-limiting selection of candidate scan chain defect conditions described above may be identified via comparison to a look-up table, setting flag, and so on.

Figure 3A:
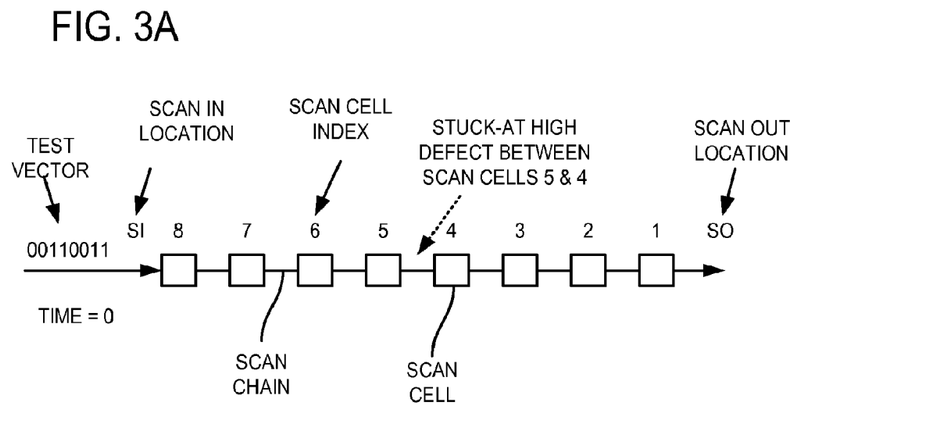
FIG. 3A schematically shows an example test vector prior to being shifted into an example scan chain during scan chain defect condition identification according to an embodiment of the present disclosure.
Figure 3B:
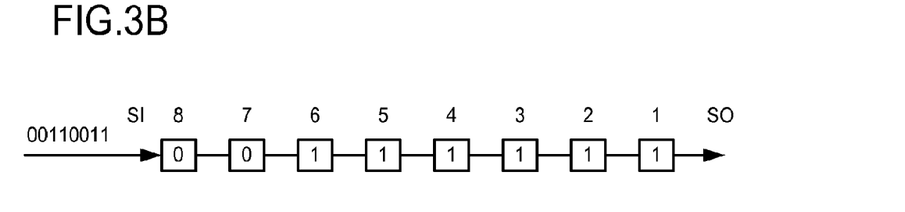
FIG. 3B schematically shows the scan chain of FIG. 3A at a time after the test vector has been shifted into the scan chain.
Figure 3C:
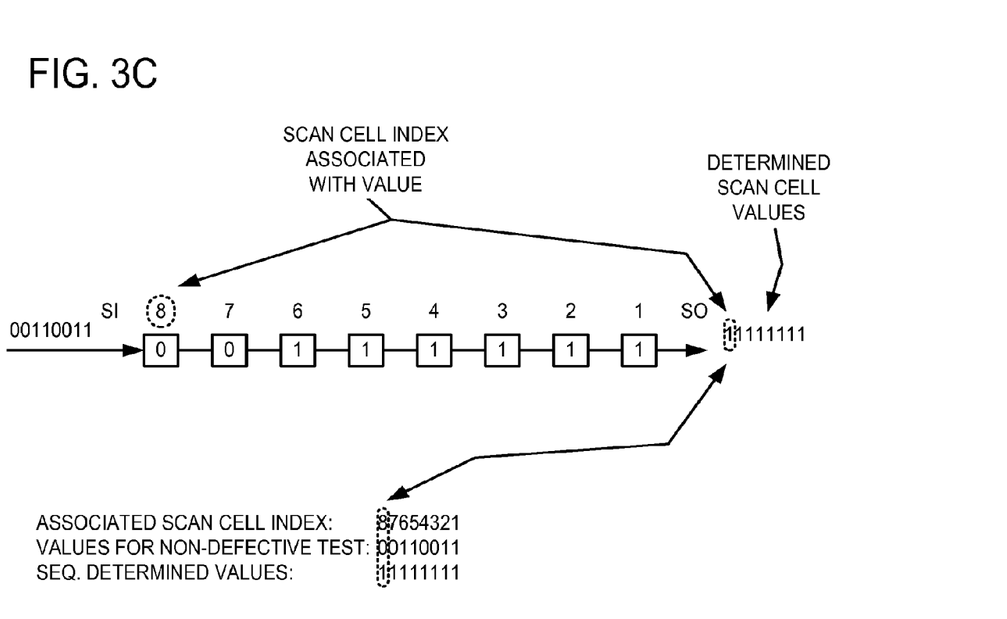
FIG. 3C schematically shows the scan chain of FIG. 3B at a time after the test vector has been shifted out of the scan chain and the scan cell values have been sequentially determined

FIGS. 3A-C schematically show an embodiment of a scan chain including eight scan cells at three successive times to illustrate how a candidate scan chain defect may be identified according to an embodiment of method 200. It will be appreciated that the example scan chain and test vector in FIGS. 3A-C are simplified for illustrative purposes, and that the example is not intended to be limiting in any sense.

The embodiment of the scan chain shown in FIGS. 3A-C includes eight scan cells, each assigned an individual scan cell index running from 1 to 8 in order starting from the scan out position and ending at the scan in position. The scan cell indices depicted in FIGS. 3A-C are illustrated as integers, though it will be appreciated that a scan cell index may include virtually any suitable identifier, including alphanumeric characters, digital bit addresses, and the like.

In the example shown in FIGS. 3A-C, a stuck-at high condition is shown between scan cells 5 and 4. As used herein, a stuck-at condition is used to describe a fault or a fault model where a signal output from a logic cell (such as a scan cell) is observed to have the same value regardless of values input to that logic cell, so that the output of that logic cell appears to be "stuck at" that same value. For example, a stuck-at condition may be used to describe a logic cell that is observed to return a logic high (i.e., 1) or a logic low (i.e., 0) regardless of input provided to the cell and despite expected behavior for that cell to the contrary. The stuck-at high condition shown in FIGS. 3A-C is merely provided as an illustrative example of how any suitable candidate scan chain defect condition may be detected according to the embodiments described herein.

FIG. 3A shows a test vector ready to be shifted into the scan chain. In FIG. 3A, the test vector is illustrated as a pattern of high and low signals "0011" that is configured to be repeated as the test vector is shifted into the scan chain. It will be appreciated that the test vector shown in FIG. 3A is merely an example test vector and that virtually any suitable test vector may be employed without departing from the present disclosure. The test vector shown in FIG. 3A is shown at the scan in location at an arbitrary reference time zero.

FIG. 3B depicts the example of FIG. 3A after 8 clock cycles, when a first portion of the test vector has been shifted in and each scan cell of the scan chain is populated by a value from the test vector. Because the combinational logic should not affect the value of the scan cells during the shift mode, the process of shifting the test vector into and out of a non-defective scan chain should not alter the test vector. Thus, for the test vector "00110011," scan cells indexed 8 through 1 would be expected to have values, of 0, 0, 1, 1, 0, 0, 1, and 1, respectively. However, because the example scan chain shown in FIG. 3B includes a stuck-at high fault that causes the output of scan cell 5 to be set to a logic high regardless of the input to scan cell high, shifting the test vector into the scan chain causes values stored in scan cells indexed 4 through 1 to each have a value of 1.

FIG. 3C depicts the example of FIG. 3B after 8 clock cycles, when a first portion of the test vector has been shifted out of the scan chain. Because the example scan chain shown in FIG. 3C includes the stuck-at high fault, shifting the test vector out of the scan chain causes values stored in scan cells indexed 4 through 1 to each have a value of 1 for the same reason described above. Further, shifting the test vector out of the scan chain causes the values stored in scan cells indexed 8 through 5 in FIG. 3B to pass through scan cell 5 causing those values to be output as logic high values. Consequently, the sequentially determined value for the test vector output at FIG. 3C is "11111111," instead of the expected value of "00110011."

FIG. 3C also shows an example of how a scan cell index may be associated with a scan cell value. As shown in FIG. 3C, at the eighth clock tick after the test vector is shifted out, the value of 1 is associated with scan cell index 8. In some embodiments, such values may be stored in a file by association to the time and/or the sequence in which the value was determined.

Based on the difference between the observed test vector output (e.g., the sequentially determined values for the scan cells) and the expected test vector output, a candidate scan chain defect condition may be identified. In the example depicted in FIGS. 3A-C, a candidate stuck-at high condition is identified. Table 1 presents a non-limiting list of candidate scan chain defect conditions that may be identified based on representative differences between an example test vector and scan chain output indicative of the various scan chain defect conditions presented therein. It will be understood that the examples presented in Table 1 are merely provided for illustrative purposes, and that they are not intended to limit the scope of the scan chain defect conditions that may potentially be identified and/or the manner by which such conditions may be identified in any way.

TABLE 1

| Candidate Scan Chain Defect Condition | Expected Test Vector Output | Observed Test Vector Output |
| --- | --- | --- |
| Stuck-at High | 0011001100110011 | 1111111111111111 |
| Stuck-at Low | 0011001100110011 | 0000000000000000 |
| Slow to Rise | 0011001100110011 | 0001000100010001 |
| Slow to Fall | 0011001100110011 | 0011101110111011 |
| Cycle Early | 0011001100110011 | 0110011001100110 |
| Cycle Late | 0011001100110011 | 0001100110011001 |

Turning back to FIG. 1, once a candidate scan chain defect condition has been identified, method 100 enters an identification phase comprising a capture mode 104, a shift mode 106, and an output mode 108. While the detection phase described above with respect to FIGS. 2 and 3A-C is directed at classifying the behavior of the scan chain defect by observing the output of the defective scan chain during a test without the confounding effects of the combinational logic, portions of the identification phase described below are directed at determining contradictions between observed logic tests (e.g., tests that check logical function of the combinational logic electrically connected with the defective scan chain) and expected output from those logic tests. These contradictions may be used to identify a reference scan cell that may be output for display and/or to help localize the candidate defect in logical and/or physical space as described in more detail below.

As used herein, a reference scan cell refers to a scan cell last determined to be at an expected logical state for that scan cell. Put another way, a reference scan cell represents, for a specific logical test, the last observable working scan cell in the order in which the scan cell values are sequentially determined.

Determination of a working scan cell may be made by comparison of the output of the scan cell to an expected value for that scan cell, so that the last scan cell to return a value that matches the expected value is identified as the reference scan cell. It will be appreciated that the expected value may be any virtually any suitable value. For example, in some embodiments, the expected value may be a value that is indicative of proper logical function for a portion of combinational logic cells associated with that scan cell. In some other embodiments, the expected value may be a value that is selected as a value that is opposite a value that would normally be returned by a scan cell influence by the candidate defect condition. For example, because a stuck-at high defect condition would normally return a 1, the last cell to return an expected value of a 0 may be identified as the reference cell. Accordingly, in such embodiments it may be possible to identify the reference cell even in situations where logical faults elsewhere in the combinational logic cells may coincidentally lead to scan chain output indicating improper logical function of those combinational logic cells.

In some embodiments, scan cell values may be determined according to a scan cell order from a scan out position to a scan in position; FIG. 3C is an example of such an embodiment. In such embodiments, the reference scan cell would be positioned closer to the scan in position than any other working scan cell (e.g., than any other scan cell having an observed value that matches an expected value for that scan cell for that logical test). It will be understood that the reference scan cell may be translated into virtually any other suitable reference cell or logical domain without departing from the scope of the present disclosure.

Figure 4:
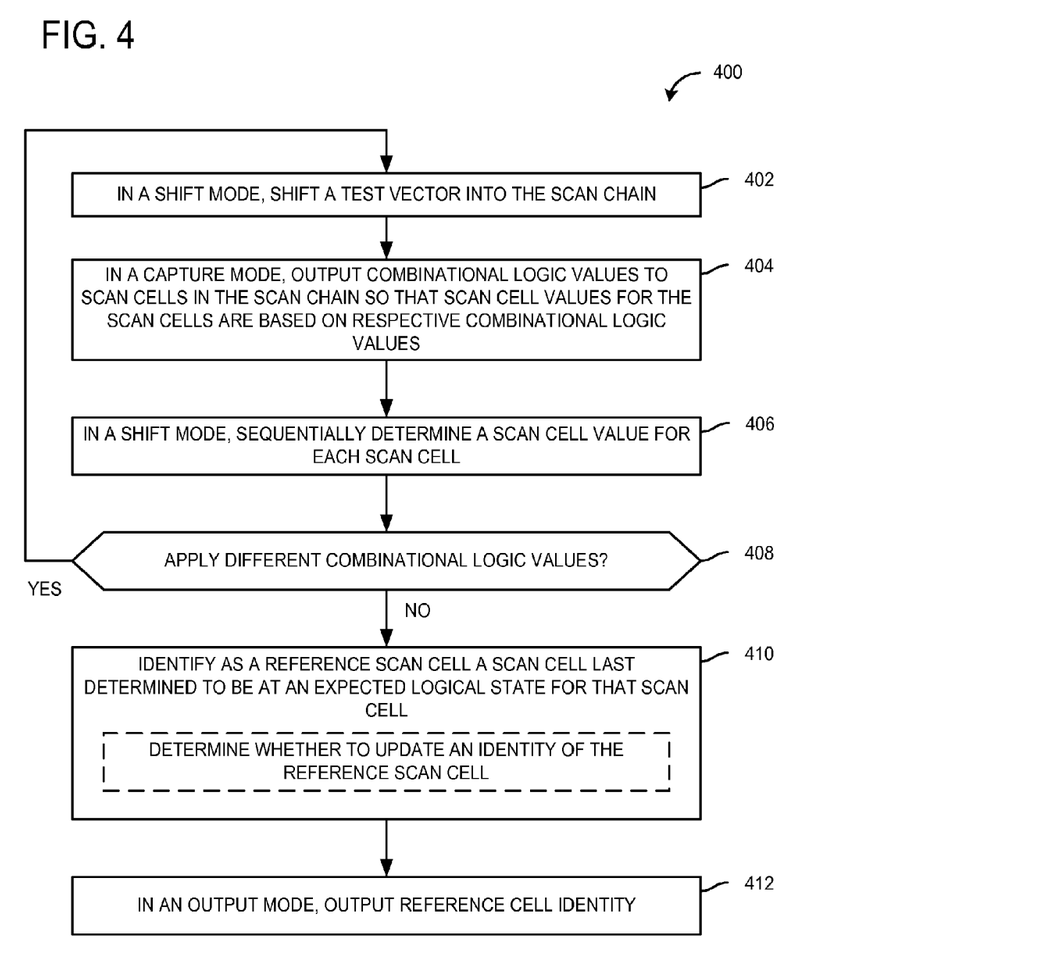
FIG. 4 shows a flowchart for a method of an identification phase according to an embodiment of the present disclosure.

FIG. 4 shows a flowchart for an embodiment of a method 400 of identifying a reference scan cell. At 402, method 400 comprises shifting a test vector into the scan chain. In some embodiments, the device may be placed into the shift mode by enabling a scan enable setting so that the test vector may be shifted into the scan chain as described above.

In the embodiment shown in FIG. 4, method 400 comprises, at 404, outputting combinational logic values to scan cells in the scan chain so that scan cell values for the scan cells are based on respective combinational logic values in a capture mode. Because method 400 is directed at identifying the reference scan cell using contradictions determined from observed logic tests, once the test vector is shifted into the scan chain, the scan chain is placed in a capture mode configured to apply the test vector to the combinational logic electrically connected with the scan chain. In some embodiments, the scan chain may be placed into a capture mode by disabling a scan enable setting (e.g., by setting a scan enable setting to 0). Once the test vector is applied, a subsequent clock cycle causes the combinational logic cells to generate values that are then output to the scan chain, so that the scan cells capture the logical behavior of the combinational logic.

At 406, method 400 comprises sequentially determining the scan cell value for each scan cell in a shift mode. Thus, the values generated by the combinational logic cells and output to the scan cells are shifted out as described above. A scan cell index may be associated with one or more of the determined values so that individual and/or groups of scan cells may be identified via the associated scan cell indices. For example, a list of scan cell indices associated with determined values that do not match values expected to be observed may be used to identify respective scan cells providing those mismatched values.

At 408, method 400 comprises determining whether to apply different combinational logic values to the scan chain. In some embodiments, determination at 408 may include a selection of a particular test vector to be applied to the scan chain. If it is judged that additional combinational logic values are to be applied, method 400 returns to 402. Additional combinational logic values may be provided by shifting different test vectors into and out of the scan chain. By providing different test vectors to the combinational logic cells for a given scan chain and comparing the scan cell indices of the respective reference scan cells subsequently identified as described in more detail below, it may be possible to discriminate intermittent defect conditions from constant defect conditions and/or to identify a reference scan cell for a defect condition that is closest to the scan chain input for the test vectors provided. For example, in some embodiments, thirty or more different test vectors may be provided, though fewer test vectors may be provided in some other embodiments.

Because a plurality of test vectors may be provided to test different portions of the combinational logic connected with the scan chain, variation within the provided test vectors may provide an approach to reduce errors that may be introduced by unrelated functional faults within the combinational logic cells. Additionally or alternatively, using a plurality of test vectors and, if appropriate, updating the identity of the reference scan cell in response, may provide a comparatively faster or more accurate approach to identifying the location of the scan cell defect relative to the reset and/or simulation techniques described above.

If additional test vectors are not applied, method 400 continues to 410, comprising identifying as the reference scan cell a scan cell last determined to be at an expected logical state for that scan cell. It will be appreciated that the specific manner by which the reference scan cell is identified may vary depending on the candidate scan cell defect condition. For example, for a scan chain exhibiting a stuck-at high defect condition, the last observed scan cell to exhibit an expected logic low state may be identified as the reference scan cell. In an embodiment where scan cell values are sequentially determined by shifting a test vector out of a scan chain from a position opposite of a position from which the test vector is shifted in, the reference scan cell may correspond to a position in the logical flow of the scan chain that is closer to the scan chain input than any other observably functional scan cell.

Figure 5:
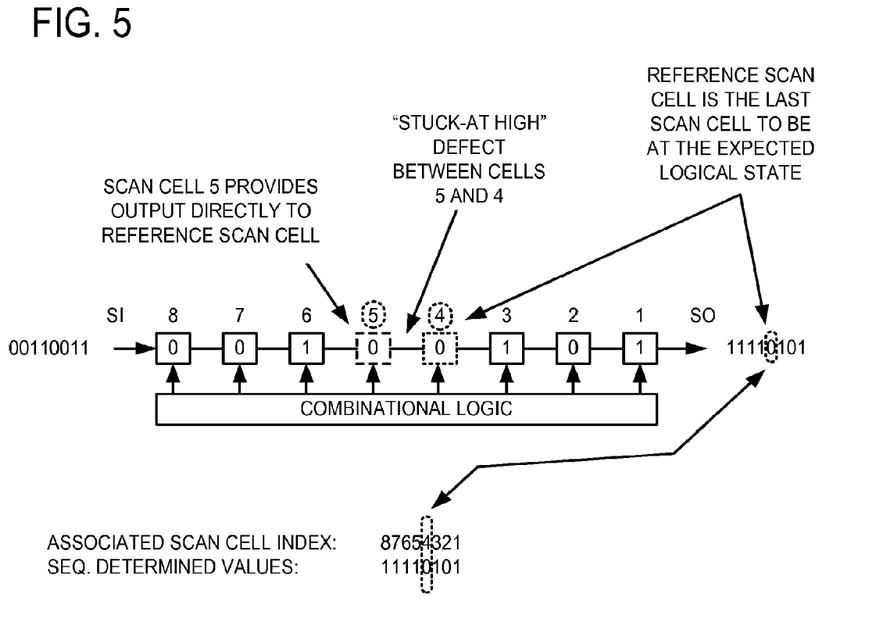
FIG. 5 schematically shows a reference scan cell identified according to an embodiment of the present disclosure.

FIG. 5 schematically shows an embodiment of a scan chain having a stuck-at high defect condition between scan cells 5 and 4. In the embodiment shown in FIG. 5, a test vector "00110011" was shifted into the scan chain during an earlier shift mode (not shown). During a capture mode, values generated by combinational logic cells are output to scan cells indexed 8 through 1 so that those scan cells have values of 0, 0, 1, 0, 0, 1, 0, and 1, respectively. During a second shift mode, the values in the scan chain are shifted out and sequentially determined. Because of the positioning of the stuck-at high defect, the actual output of the scan chain is observed as "11110101" instead of the expected output of "00100101."

The example shown in FIG. 5 illustrates how the differences between the expected output and the observed output of the scan chain may be used to identify the reference scan cell. As explained above, the identity of the reference scan cell may be determined by comparing the sequentially determined values of the scan cells shifted out of the scan chain with values expected to be output from the scan chain. In this example, because the candidate scan chain defect condition is a stuck-at high condition that normally returns a 1, the expected value used to identify the reference scan cell is 0. Accordingly, FIG. 5 shows that scan cell 4, being the last scan cell to have a value determined to be at the expected logical state of 0, is identified as the reference scan cell.

In some embodiments, the expected value may comprise a plurality of values output by the scan chain. For example, in some embodiments, the reference scan cell may be identified from a pair of scan cells last exhibiting an expected transition between two logical states. In such embodiments, the reference scan cell may be identified as the scan cell of that pair that is closer to the scan chain input. By comparing a plurality of values from the observed scan chain output to a plurality of expected values, it may be possible to identify reference scan cells related to transition delay faults such as a slow to rise fault conditions, a slow to fall fault condition, a cycle early fault condition, and a cycle late fault condition. Such transition delay faults may indicate the existence of a hold time violation caused by a defect in a clock input to a scan cell to which the transition delay is traceable. Alternatively, such transition delay faults may indicate the existence of a setup time violation caused by a defect in a data input to a scan cell to which the transition delay is traceable.

Figure 6:
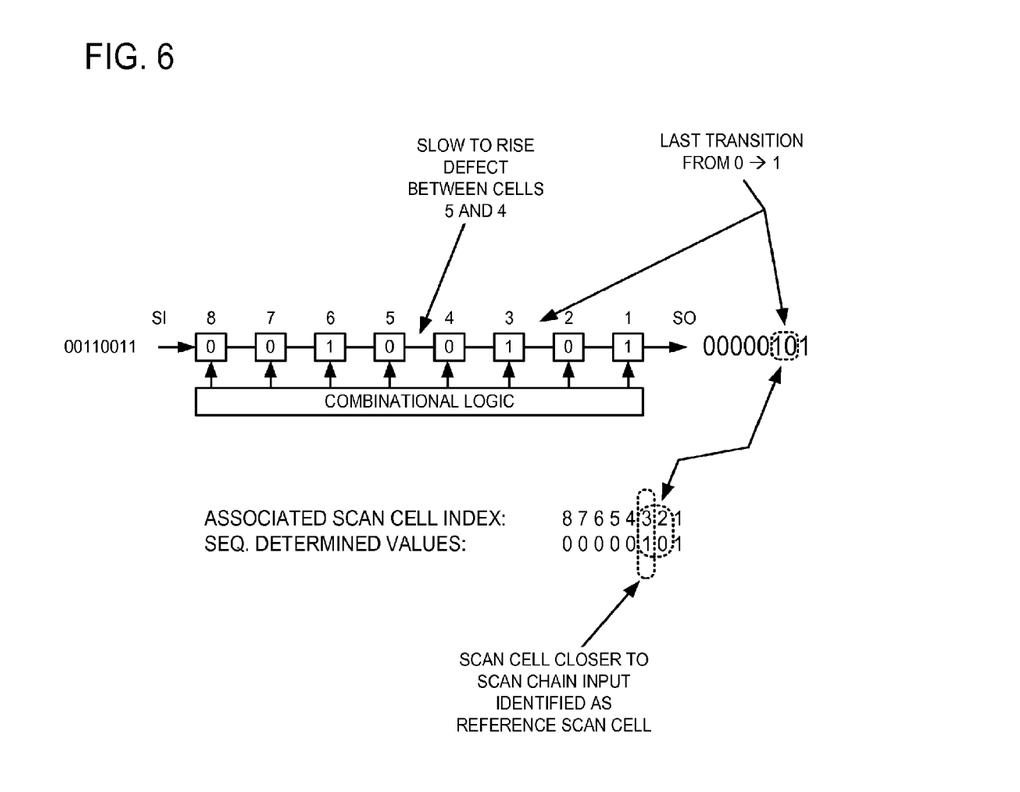
FIG. 6 schematically shows a reference scan cell identified according to another embodiment of the present disclosure.

For example, FIG. 6 schematically shows an embodiment of a scan chain having a slow to rise defect condition between scan cells 5 and 4. As used herein, a slow to rise condition is used to describe a fault or a fault model where a signal output from a logic cell (such as a scan cell) exhibits a delay in a transition from a logic low to a logic high state, so that the output of that logic cell remains at a logic low state by one or more clock cycles compared to a normally operating cell before transitioning to the logic high state. However, a subsequent transition from the logic high state to the logic low state does not appear delayed in a slow to rise defect condition. Thus, a slow to rise condition only manifests as a delay in the rising transition, while the falling transition is undelayed. A non-limiting example of slow to rise behavior may be found in Table 1.

In the example shown in FIG. 6, a test vector "00110011" was shifted into the scan chain during an earlier shift mode (not shown). During a capture mode, values generated by combinational logic cells are output to scan cells indexed 8 through 1 so that those scan cells have values of 0, 0, 1, 0, 0, 1, 0, and 1, respectively. During a second shift mode, the values in the scan chain are shifted out and sequentially determined. Because of the positioning of the slow to rise defect, the actual output of the scan chain is observed as "00000101" instead of the expected output of "00100101." The reference scan cell is identified by comparing the sequentially determined values of the scan cells shifted out of the scan chain with values expected to be output from the scan chain. Because the slow to rise condition shown in the example illustrated in FIG. 6 would normally return a pair of logic low values instead of a transition from a 0 to a 1, identifying the reference scan cell includes identifying the last transition from a 0 to a 1 that is indicative of proper logical function for a portion of combinational logic cells associated with that scan cell. Put another way, the last transition from a 0 to a 1 that matches an expected transition from a 0 to a 1 will be used to identify the reference scan cell. In the example shown in FIG. 6, the last transition from 0 to 1 corresponds to the values in scan cells 3 and 4, which are determined in sequentially in that order. Once the last transition is identified, the reference scan cell is identified by selecting the scan cell of that pair of scan cells (e.g., scan cells 3 and 4) that is closer to the scan chain input (i.e., scan cell 4).

A similar approach may be used to identify reference scan cells for other transition delay faults. For example, the approach described above for identifying a reference scan cell for a slow to rise condition may also be employed to identify a reference scan cell for a cycle late condition. As used herein, a cycle late condition describes a fault or a fault model where a signal output from a logic cell exhibits a delay in a transition from a logic low state to a logic high state, so that the output of that logic cell remains at a logic low state by one or more clock cycles compared to a normally operating cell before transitioning to the logic high state, and where a subsequent transition from the logic high state to a logic low state is also delayed by one or more clock cycles before transitioning to a logic low state.

As another example, a last transition from a 1 to a 0 may be used to identify a reference scan cell for a slow to fall condition. As used herein, a slow to fall condition describes a fault or a fault model where a signal output from a logic cell exhibits a delay in a transition from a logic high state to a logic low state, so that the output of that logic cell remains at a logic high state by one or more clock cycles compared to a normally operating cell before transitioning to the logic low state while a subsequent transition from the logic low state to a logic high state is not delayed.

As yet another example, the approach described above for identifying a reference scan cell for a slow to fall condition may also be employed to identify a reference scan cell for a cycle early condition. As used herein, a cycle early condition describes a fault or a fault model where a signal output from a logic cell exhibits a delay in a transition from a logic high state to a logic low state, so that the output of that logic cell remains at a logic high state by one or more clock cycles compared to a normally operating cell before transitioning to the logic low state, and where a subsequent transition from the logic low state to a logic high state is also delayed by one or more clock cycles before transitioning to a logic high state.

While the examples above describe transitions between two logic states, it will be appreciated that any suitable logic transition sequence comprising any suitable number of bits may be used to identify a reference scan cell associated with a candidate scan chain defect without departing from the scope of the present disclosure. For example, in some embodiments, an alternating three-bit logic sequence may be used to identify a reference scan cell associated with an open defect (e.g., a defect mode that may mimic an incomplete circuit). For example, because an open defect may be affected by surrounding logic cells and/or wires via capacitive coupling, it is possible that a scan cell exhibiting an open defect may not produce a transition from a 0 to a 1 to a 0 when a physically adjacent wire is in a logic low state. Thus, in some of such embodiments, a transition from a 0 to a 1 to a 0 may be used to identify a reference scan cell associated with an open defect.

Returning to FIG. 4, in some embodiments, identifying the reference scan cell at 410 may include determining whether to update an identity of the reference scan cell. In some embodiments, a determination about whether to update the identity of the reference scan cell may be made based on comparisons of scan cell indices of respective reference scan cells identified as the result of a plurality of different test vectors applied to the scan chain. For example, the identity of the reference scan cell may be updated if a scan cell identified as the reference scan cell is determined to be closer to a scan chain input than a scan cell previously identified as the reference scan cell.

Figure 7:
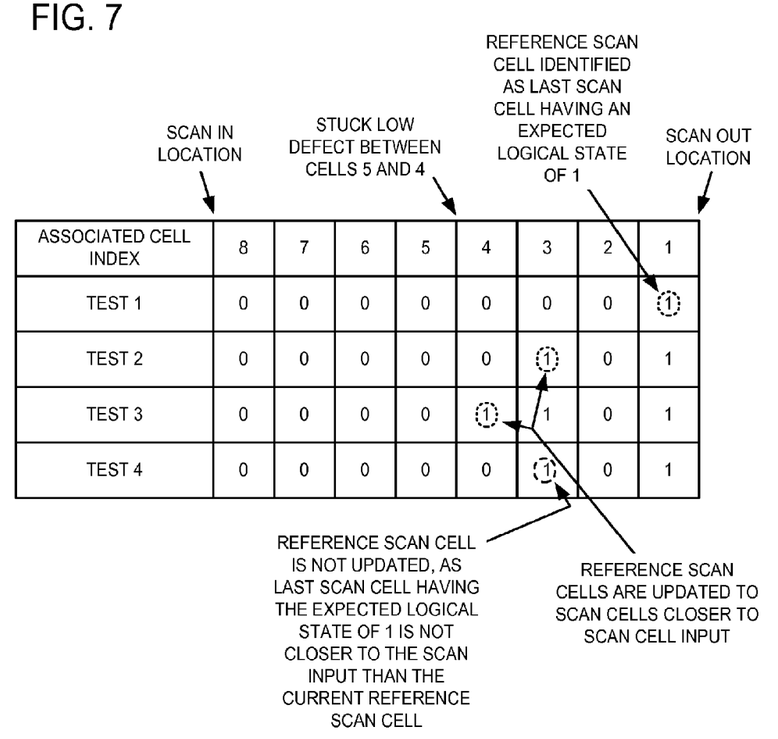
FIG. 7 shows, in tabular form, a method of determining whether to update an identity of a reference scan cell according to an embodiment of the present disclosure.
Figure 8:
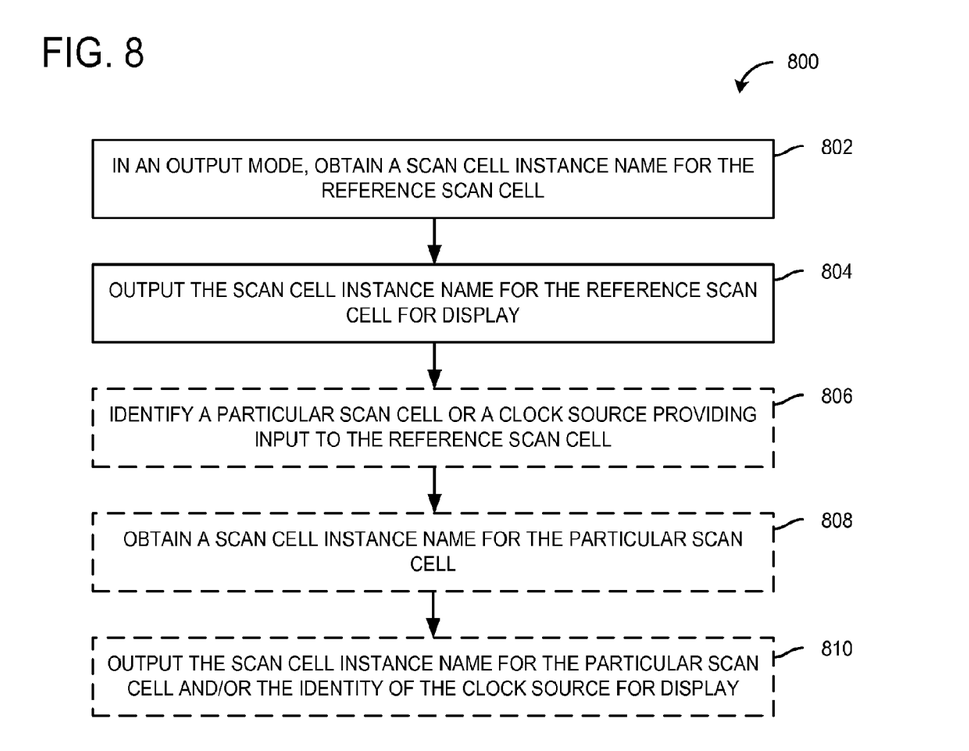
FIG. 8 shows a flowchart for a method of outputting reference scan cell information according to an embodiment of the present disclosure.

FIG. 7 shows a table of scan cell values output from an example scan chain from four successive example tests using four different example test vectors labeled tests 1 through 4 according to the embodiments described herein. For reference, a list of scan cell indices associated with the scan cell values output from the scan chain is provided along a positional indication of the scan chain input and the scan chain output relative to those cells. As shown in FIG. 8, a stuck-at low condition exists between scan cells 4 and 5 in the scan chain. Accordingly, the reference scan cell will be identified with reference to the last determined logic high state in a particular test. For example, scan cell 1 is identified as the reference scan cell in test 1.

In the embodiment shown in FIG. 7, the identity of the reference scan cell is updated if it is determined that the reference scan cell is closer to the scan cell input than previously identified reference scan cells. For example, scan cell 3 is identified as the reference scan cell in test 2. Because scan cell 3 is closer to the scan input location than scan 1, the identity of the reference scan cell is updated to scan cell 3. The identity of the reference scan cell is updated again after test 3, where scan cell 4 is identified as the reference scan cell. However, the identity of the reference scan cell is not updated after test 4 because the last scan cell to have a logical state of 1 is scan cell 3, which is not closer to the scan chain input than scan cell 4.

Continuing with FIG. 4, method 400 includes, at 412, outputting the reference cell identity in an output mode. FIG. 8 shows an embodiment of a method 800 for outputting a reference cell identity. Method 800 includes, at 802, obtaining a scan cell instance name for the reference scan cell. In some embodiments the scan cell instance name may be obtained with reference to the scan cell index for that scan cell. For example, in some of such embodiments, an instance name may be obtained by looking up the scan cell index associated with the scan cell, either directly or by suitable translation, in a standard test interface language (STIL) file associated with the scan chain. However, it will be appreciated that virtually any suitable manner of obtaining a scan cell instance name in virtually any suitable format may be employed without departing from the scope of the present disclosure.

At 804, method 800 includes outputting the scan cell instance name for the reference scan cell for display. In some embodiments, other information may be output for display, including the candidate scan chain defect condition, previously identified reference scan cells, statistical information related to various scan cells successively identified as the reference scan cell, and the like. Further, in some embodiments, logical and/or physical layout information associated with the reference scan cell instance name may be output. For example, in one scenario, a portion of the logical and/or physical layout of the scan chain including the reference scan cell may be output for display.

Because defects may actually exist on a net connecting another scan cell to the reference scan cell, in some embodiments the identity of another scan cell and/or a clock source that provides input to the reference scan cell may be output. In some scenarios the input of the particular scan cell and/or the clock source may be directly connected to the input of the reference scan cell. Accordingly, in some embodiments, method 800 may include, at 806, identifying a particular scan cell and/or a particular clock source providing input to the reference scan cell, which may include identifying a particular scan cell and/or a particular clock source having an input directly connected to an input of the reference scan cell. At 808, method 800 includes obtaining a scan cell instance name for the particular scan cell, such as by using a scan cell index for that particular scan cell. Then, at 810, method 800 may include outputting the scan cell instance name for the particular scan cell and/or the identity of the clock source providing input to the reference scan cell for display.

It will be appreciated that methods described herein are provided for illustrative purposes only and are not intended to be limiting. Accordingly, the methods shown in the figures and described herein may include additional or alternative processes in some embodiments, and in some embodiments, some processes may be reordered or omitted without departing from the scope of the present disclosure.

Figure 9:
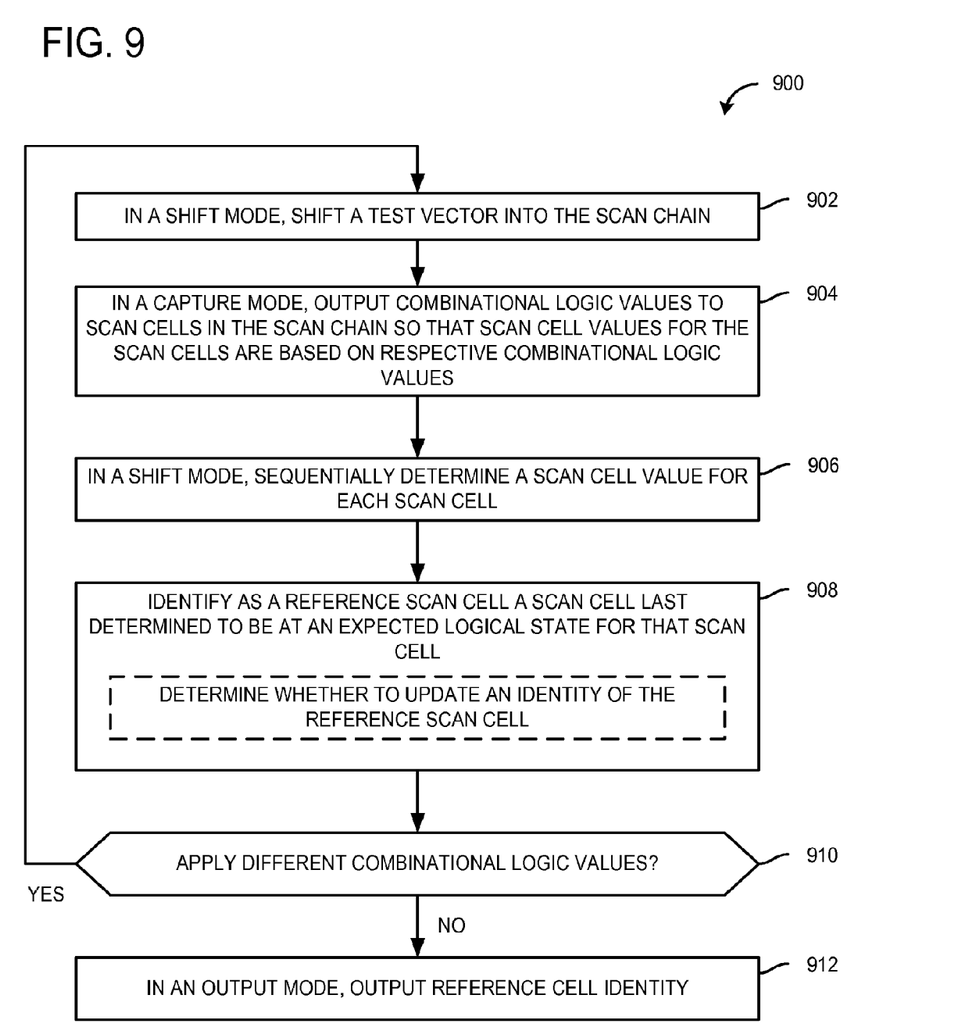
FIG. 9 shows a flowchart for another method of an identification phase according to an embodiment of the present disclosure.

For example, FIG. 9 shows a flowchart for an embodiment of a method 900 of identifying a reference scan cell comprising shifting a test vector into a scan chain at 902, outputting combinational logic values to scan cells in the scan chain so that scan cell values for the scan cells are based on respective combinational logic values at 904, sequentially determining a scan cell value for each scan cell at 906, and identifying as a reference scan cell a scan cell last determined to be at an expected logical state for that scan cell at 908. At 910, method 900 includes determining whether to apply different combinational logic values. In some embodiments, determination at 910 may include a selection of a particular test vector to be applied to the scan chain. If it is judged that additional combinational logic values are to be applied, such as for the reasons described above, method 900 returns to 902. If additional combinational logic values are not applied, method 900 continues to 912 where the reference cell identity is output in an output mode. In some embodiments, judgment and selection of a particular test vector may depend, at least in part, on the identification of the reference scan cell at 906, so that the identity of the reference scan cell may influence selection of one or more successive test vectors. Such approaches may assist with defect localization when used with test hardware configured to store less capture data than may be generated from the set of test vectors input to the scan chain.

Figure 10:
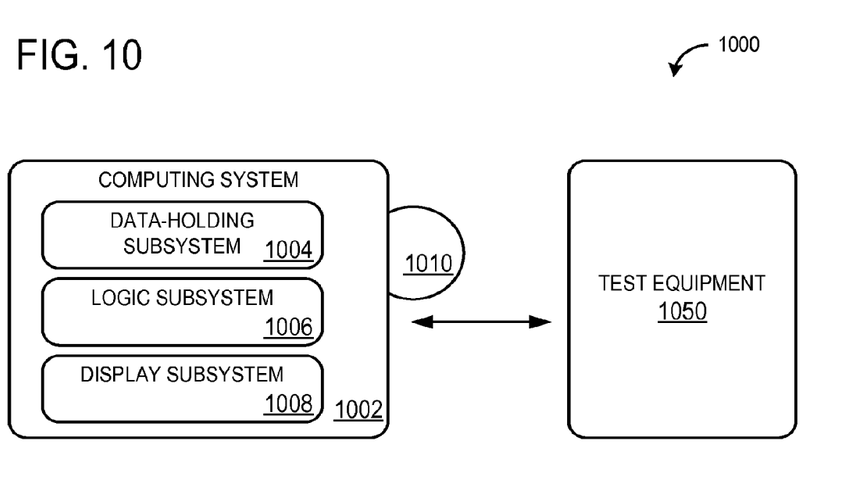
FIG. 10 schematically shows a failure analysis system according to an embodiment of the present disclosure.

Further, it will be appreciated that the methods described herein may be suitably performed by virtually any suitable hardware and/or software. FIG. 10 schematically shows an embodiment of a failure analysis system 1000 that may be used to detect a scan chain defect condition and identify a reference scan cell related to that defect condition. Failure analysis system 1000 includes a computing system 1002 having a data-holding subsystem 1004, a logic subsystem 1006, and a display subsystem 1008. In the embodiment depicted in FIG. 10, computing system 1002 is in operative communication with suitable test equipment 1050 configured to perform logic function tests on a semiconductor device. However, it will be appreciated that test equipment 1050 may be optional in some embodiments. For example, in some embodiments the processes described herein may be performed by computing system 1002 using data previously collected by suitable test equipment without computing system 1002 being in operative communication with that test equipment.

Instructions held in data-holding subsystem 1004 and executed by logic subsystem 1006 may be used to perform various method described herein. Data-holding subsystem 1004 may include one or more physical, non-transitory, devices configured to hold data and/or instructions excluding a signal per se that are executable by logic subsystem 1006 to implement the methods and processes described herein. For example, data-holding subsystem 1004 may include one or more hard disks, flash drives, memory devices, caches, and/or registers configured to hold data and/or instructions.

Logic subsystem 1006 may include one or more physical devices configured to execute one or more instructions stored in data-holding subsystem 1004. For example, logic subsystem 1006 may include one or more processors that are configured to execute software instructions.

Display subsystem 1008 may be used to present the output described herein in a manner so that the output may be transformed into a visually cognizable form. Display subsystem 1008 may include any suitable display device, which may be combined in a shared enclosure with data-holding subsystem 1004 and logic subsystem 1006 or which may be include one or more peripheral display devices.

FIG. 10 also shows removable computer-readable storage media 1010, which may be used to store and/or transfer data and/or instructions executable to implement the methods and processes described herein. It will be appreciated that any suitable removable computer-readable storage media excluding a signal per se may be employed without departing from the scope of the present disclosure. Non-limiting examples include DVDs, CD-ROMs, floppy discs, and flash drives.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method for testing an integrated circuit, comprising the steps of:
shifting a test vector into a scan chain of the integrated circuit;
outputting combinational logic values to scan cells in the scan chain so that scan cell values for the scan cells are based on respective combinational logic values, the combinational logic values being generated by combinational logic cells electrically connected with the scan chain;

sequentially determining the scan cell value for each scan cell;

identifying as a reference scan cell a scan cell last determined to be at an expected logical state for that scan cell;

determining whether there is a candidate reference cell that is closer to an input end of the scan chain than the identified reference scan cell; and in the case that there is a candidate reference cell that is closer to an input end of the scan chain than the identified reference scan cell, replacing the identified reference cell with the candidate reference cell as a new identified reference cell for assessing a defect in the integrated circuit.

2. The method of claim 1 in which the reference scan cell is identified from scan cells including a pair of scan cells last exhibiting an expected transition between two logical states, wherein the reference scan cell is identified as the scan cell of the pair that is closer to the input end of the scan chain.

3. The method of claim 1 in which scan cell values are sequentially determined by shifting a test vector out of a scan chain from a position opposite a position from which the test vector is shifted in and the reference scan cell corresponds to a position in a scan chain that is closer to the input end of the scan chain than any other scan cell that is observably functional.

4. The method of claim 1 further including sequentially assigning to each scan cell a scan cell index according to a scan cell order, the scan cell index assigned to each scan cell being different from the scan cell index of each other scan cell.

5. The method of claim 4 further including determining whether to identify an updated reference scan cell based on a comparison of scan cell indices of respective reference scan cells identified from plural test vectors applied to a scan chain.

6. The method of claim 5 in which an updated reference scan cell is identified if a scan cell identified as the reference scan cell is determined to be closer to a scan chain input than a scan cell previously identified as the reference scan cell.

* * * * *